United States Patent
Chang et al.

(10) Patent No.: US 7,764,555 B2
(45) Date of Patent: Jul. 27, 2010

(54) LEAKAGE TESTING METHOD FOR DYNAMIC RANDOM ACCESS MEMORY HAVING A RECESS GATE

(75) Inventors: Chung-Yuan Chang, Taipei County (TW); Ming Hsieh Tsai, Hsinchu (TW); Che-Yi Hsu, Changhua County (TW); Yuan-Hwa Lee, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 208 days.

(21) Appl. No.: 12/173,823

(22) Filed: Jul. 16, 2008

(65) Prior Publication Data
US 2009/0303817 A1 Dec. 10, 2009

(30) Foreign Application Priority Data
Jun. 10, 2008 (TW) .............................. 97121568 A

(51) Int. Cl.
*G11C 29/00* (2006.01)
(52) U.S. Cl. ...................... 365/201; 365/149; 365/150; 365/191
(58) Field of Classification Search .................. 365/149, 365/150, 201, 191
See application file for complete search history.

(56) References Cited
U.S. PATENT DOCUMENTS
5,191,555 A * 3/1993 Tabacco et al. ........ 365/230.08
7,460,426 B2 * 12/2008 Sadakata .................... 365/222
7,529,144 B2 * 5/2009 Sadakata .................... 365/201

* cited by examiner

*Primary Examiner*—Pho M Luu
*Assistant Examiner*—Tha-O Bui
(74) *Attorney, Agent, or Firm*—Jianq Chyun IP Office

(57) ABSTRACT

A leakage testing method for a DRAM having a recess gate is provided. The method includes the steps of: programming to set the first storage unit and the second storage unit of a same memory cell with different storage statuses; and disturbing one of the word lines extending through the memory cells; then determining whether the DRAM is acceptable or not. When another one of the word lines extending through the memory cells is caused with a reading error by disturbing the one of the word lines extending through the memory cells, a failure is determined as occurred, and the failure is attributed to a leakage type of extended depletion region. When the another one of the word lines extending through the memory cells is not caused with a reading error by disturbing the one of the word lines extending through the memory cells, the DRAM is determined as acceptable.

14 Claims, 11 Drawing Sheets

US 7,764,555 B2

LEAKAGE TESTING METHOD FOR DYNAMIC RANDOM ACCESS MEMORY HAVING A RECESS GATE

CROSS-REFERENCE TO RELATED APPLICATION

This application claims the priority benefit of Taiwan application Ser. No. 97121568, filed Jun. 10, 2008. The entirety of the above-mentioned patent application is hereby incorporated by reference herein and made a part of this specification.

BACKGROUND OF THE INVENTION

1. Field of the Invention

The present invention generally relates to a failure testing method for a dynamic random access memory (DRAM), and more particularly, to a leakage testing method for a DRAM having a recess gate.

2. Description of Related Art

Ultra-Large Scale Integration (ULSI) technology is being progressively developed, and correspondingly, very small defects generated during the processing become a critical role determining the occurrence of an ULSI circuit. Recently, a failure test process testing failures occurred during the processing has become a necessary standard procedure of the processing.

Regarding a DRAM, a gross function test is often executed to the memory element, in which a simply reading/writing test for determining whether the product is acceptable or rejected. A failure of a memory element determined during such a gross function test is attributed to a physical failure. Then, those products determined as acceptable during the gross function test will be executed with a leakage test for finding out rejected products for guaranteeing the quality of the products.

However, when the IC circuit processing is progressed further to a sub-micro scale, while the memory element is developed from a 2-dimensional structure to a 3-dimensional structure, the failure mechanism becomes more complicated and more difficult to find out the exact reason of the failures.

SUMMARY OF THE INVENTION

Accordingly, the present invention is directed to provide leakage testing method for a DRAM having a recess gate, which is adapted for fast and correctly finding out the reason of failure occurrence.

The present invention provides a leakage testing method for a DRAM having a recess gate, adapted for applying for a memory array. The memory array includes a plurality of memory cells, sequentially and parallel arranged word lines, and a plurality of sequentially and parallel arranged bit lines, the word lines are substantially perpendicular with the bit lines. The bit lines include a first bit line and a second bit line. The first bit line and the second bit line are connected with a first memory cell and a second memory cell of the plurality of memory cells, respectively. The first memory cell and the second memory cell include a first storage unit and a second storage unit, respectively. Each first storage unit and each second storage unit are at a first storage status and a second storage status, respectively. A storage electrical potential of the first storage status is lower than a storage electrical potential of the second storage status. The word lines include a first word line, a second word line, a third word line, and a fourth word line. The first word line and the second word line extend between the first storage unit and the second storage unit of the first memory cell. The third word line and the fourth word line extend between the first storage unit and the second storage unit of the second memory cell. The second storage unit of the first memory cell is adjacent to the first storage unit of the second memory cell. The leakage testing method includes the following steps. The first storage unit and the second storage unit of a same memory cell are programmed so as to set with different storage statuses. One of the word lines extending through each of the memory cells is disturbed. The DRAM is determined to be acceptable or not. When another one of the word lines extending through each of the memory cells is caused with a reading error by disturbing the one of the word lines extending through each of the memory cells, a failure is determined as occurred, and the failure is attributed to a leakage type of extended depletion region. When the another one of the word lines extending through each of the memory cells is not caused with a reading error by disturbing the one of the word lines extending through each of the memory cells, the DRAM is determined as acceptable.

According to the foregoing discussion, the leakage testing method for a DRAM having a recess gate of the present invention is capable of fast and correctly finding out the reason of leakage occurrence, and is helpful for further improving the processing and the products.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
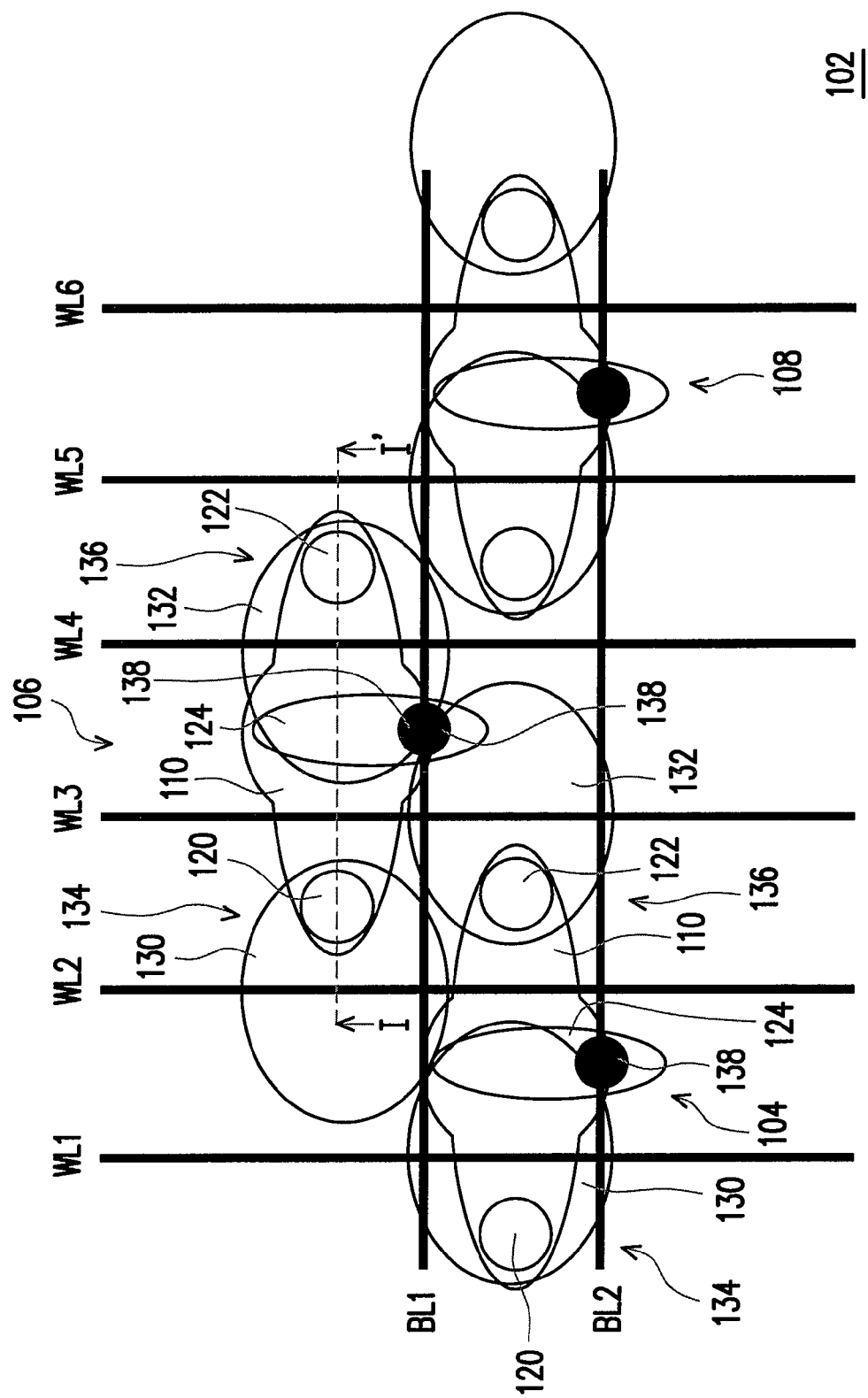
FIG. 1 is a top view demonstrating a DRAM having a recess gate according to an embodiment of the present invention.

Reference will now be made in detail to the present preferred embodiments of the invention, examples of which are illustrated in the accompanying drawings. Wherever possible, the same reference counting numbers are used in the drawings and the description to refer to the same or like parts.

The present invention provides a leakage testing method for a dynamic random access memory (DRAM) having a recess gate. The leakage testing method is adapted for determining whether the DRAM is acceptable, and analyzing reasons of leakage occurrence. A structure of the DRAM having a recess gate is to be exemplified below.

Figure 2:
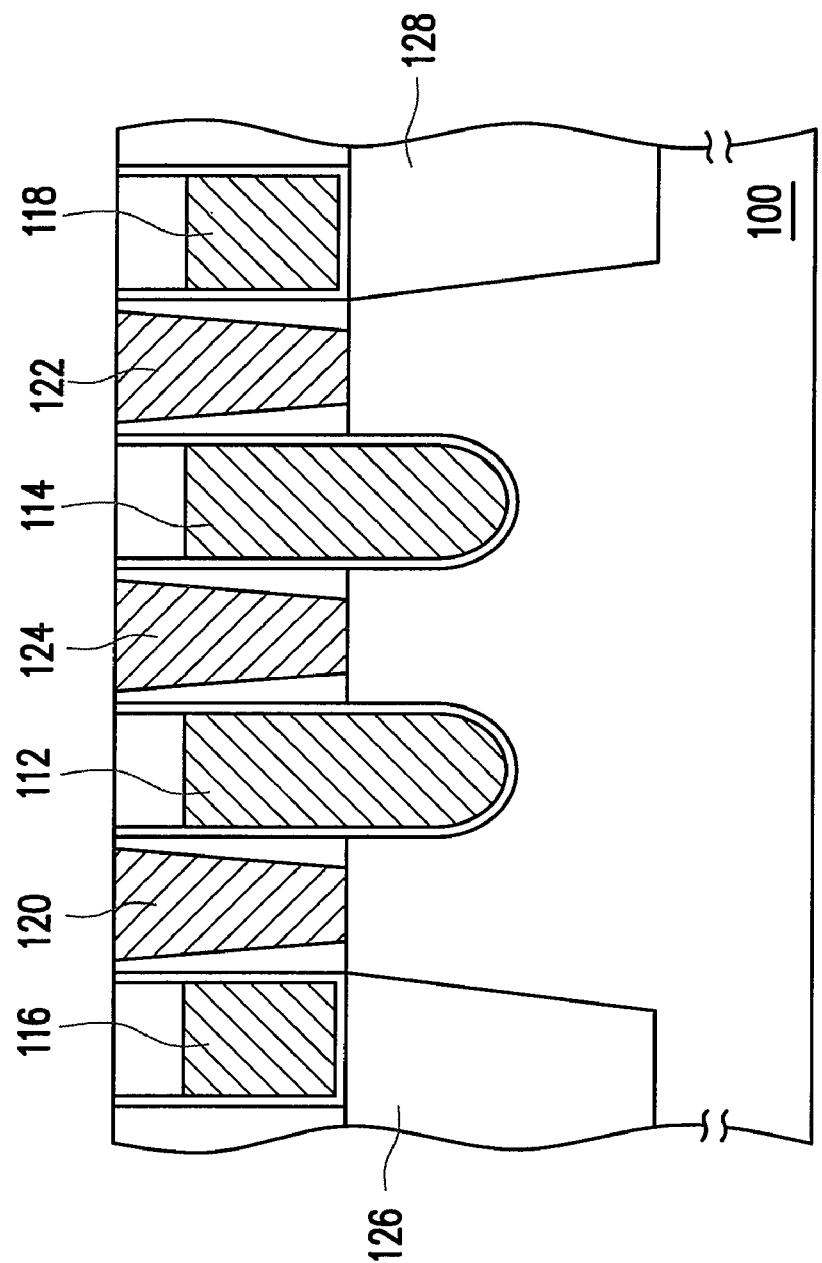
FIG. 2 is a cross-sectional view of a word line along I-I' line of FIG. 1.

FIG. 1 is a top view demonstrating a DRAM having a recess gate according to an embodiment of the present invention. FIG. 2 is a cross-sectional view of a word line along I-I' line of FIG. 1.

Referring to FIGS. 1 and 2, a memory array 102 includes memory cells 104, 106, and 108, word lines WL1 through WL6, and bit lines BL1 and BL2. The word lines WL1 through WL6 extend along a column direction, and the bit lines BL1 and BL2 extend along a row direction.

Each of the memory cells 104, 106, and 108 includes a substrate 100, an active area 110, recess gates 112, 114, passing gates 116, 118, contact windows 120, 122, 124, isolation structure 126, 128, and capacitors, 132. The active area 110 is positioned between the isolation structures 126, 128.

A part of the recess gates 112, 114 is buried in the substrate 100, which is for example a part of a word line extending though the active area 110.

The passing gates 116, 118 are disposed on the isolation structures 126 and 128, respectively, which are for example parts of word lines extending through two sides of the active area 110.

The contact window 120 is disposed on the substrate 100 between the recess gate 112 and the passing gate 116, for connecting with the capacitor 130 thereabove.

The contact window 122 is disposed on the substrate 100 between the recess gate 114 and the passing gate 118, for connecting with the capacitor 132 thereabove.

The contact window 124 is disposed on the substrate 100 between the recess gate 112 and the recess gate 114, for connecting with the bit line thereabove.

Each of the memory cells 104, 106, 108 includes a first storage unit 134, and a second storage unit 136. The first storage unit 134, and the second storage unit 136 are positioned at two sides of the contact window 124. Each first storage unit 134 and each second storage unit 136 can be at a first storage status and a second storage status, respectively. A storage electrical potential of the first storage status is lower than that of the second storage status. In the current embodiment, the first storage status having a lower storage electrical potential for example stores a data "0", and the second storage status having a higher storage electrical potential for example stores a data "1".

Further, a second storage unit of one of two adjacent memory cells is adjacent to a first storage unit of another one of the two adjacent memory cells. For example, the second storage unit 136 of the memory cell 104 is adjacent to the first storage unit 134 of the memory cell 106.

The word lines WL1 through WL6 are sequentially and parallel arranged. The word lines WL1 and WL2 extend between the first storage unit 134 and the second storage unit 136 of the memory cell 104. The word lines WL3 and WL4 extend between the first storage unit 134 and the second storage unit 136 of the memory cell 106. The word lines WL5 and WL6 extend between the first storage unit 134 and the second storage unit 136 of the memory cell 108.

The bit lines BL1 and BL2 are substantially perpendicular with the word lines WL1 through WL6. The bit line BL1 is connected with the memory cell 106. The bit line BL2 is connected with the memory cells 104 and 108. The bit lines BL1 and BL2 are connected with the memory cells 104, 106, 108 via the contact windows 124, 138.

Figure 3:
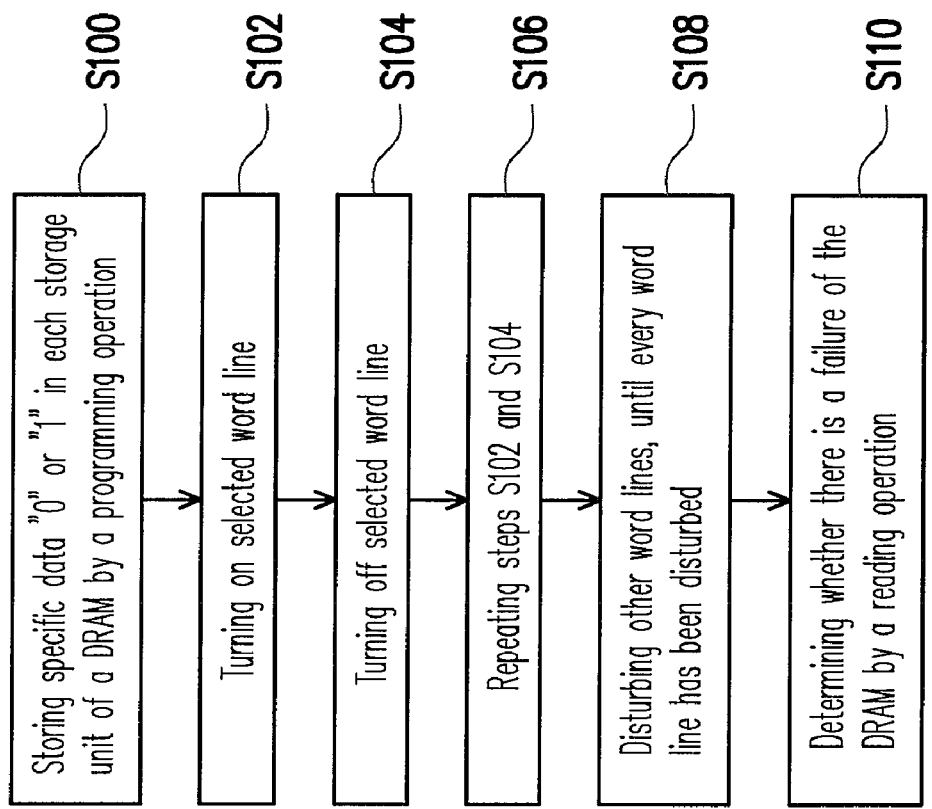
FIG. 3 is a flow chart demonstrating a procedure of a leakage testing method according to an embodiment of the present invention.

FIG. 3 is a flow chart demonstrating a procedure of a leakage testing method according to an embodiment of the present invention.

Referring to FIG. 3, a step S100 is performed, wherein a specific data "0" or "1" is stored in each storage unit of a DRAM by a programming operation.

Then, a step S 102 is performed, wherein selected word lines are turned on.

Afterwards, a step S104 is performed, wherein the selected word lines are turn off.

After that, a step S106 is performed, wherein the steps S102 and S104 are repeated. The repetition of turning on and turning off the selected word lines is known as a disturbing operation. Factors of the disturbing operation includes operation times (N), and operation time (tRAS). The repetition times of turning on and turning off the selected word lines is determined by the operation times (N). A time of each time turning on or turning off the selected word lines is determined by the operation time (tRAS).

Then, a step S108 is performed, wherein other word lines are disturbed, until all word lines have been disturbed.

Afterwards, a step S110 is performed, determining whether there is a failure of the DRAM occurred by a reading operation. When the read data differs from the written data, a failure is determined as occurred. When the read data is the same as the written data, the DRAM is determined as acceptable.

Figure 4:
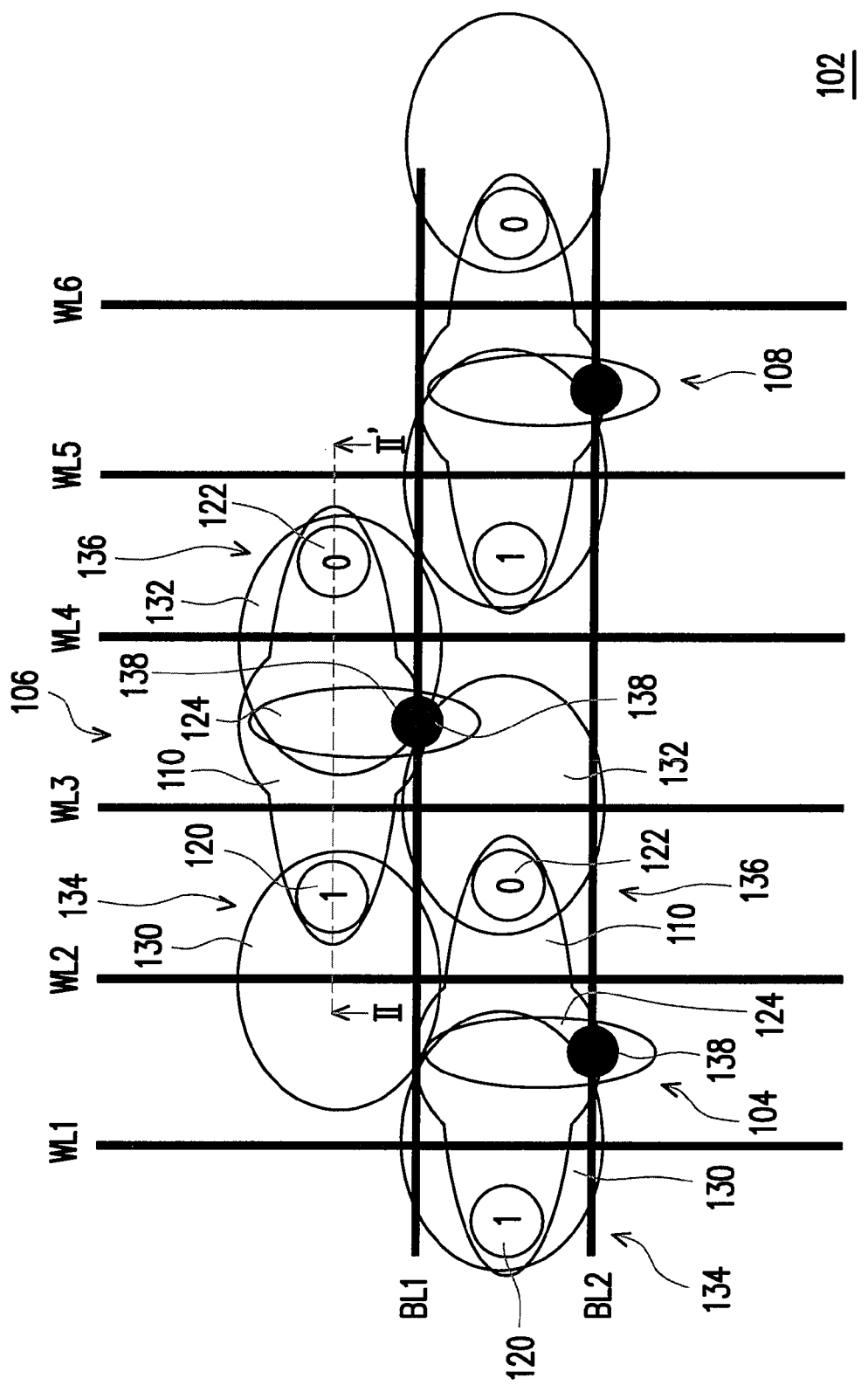
FIG. 4 is a top view of a DRAM being tested by a first type leakage test according to an embodiment of the present invention.
Figure 5:
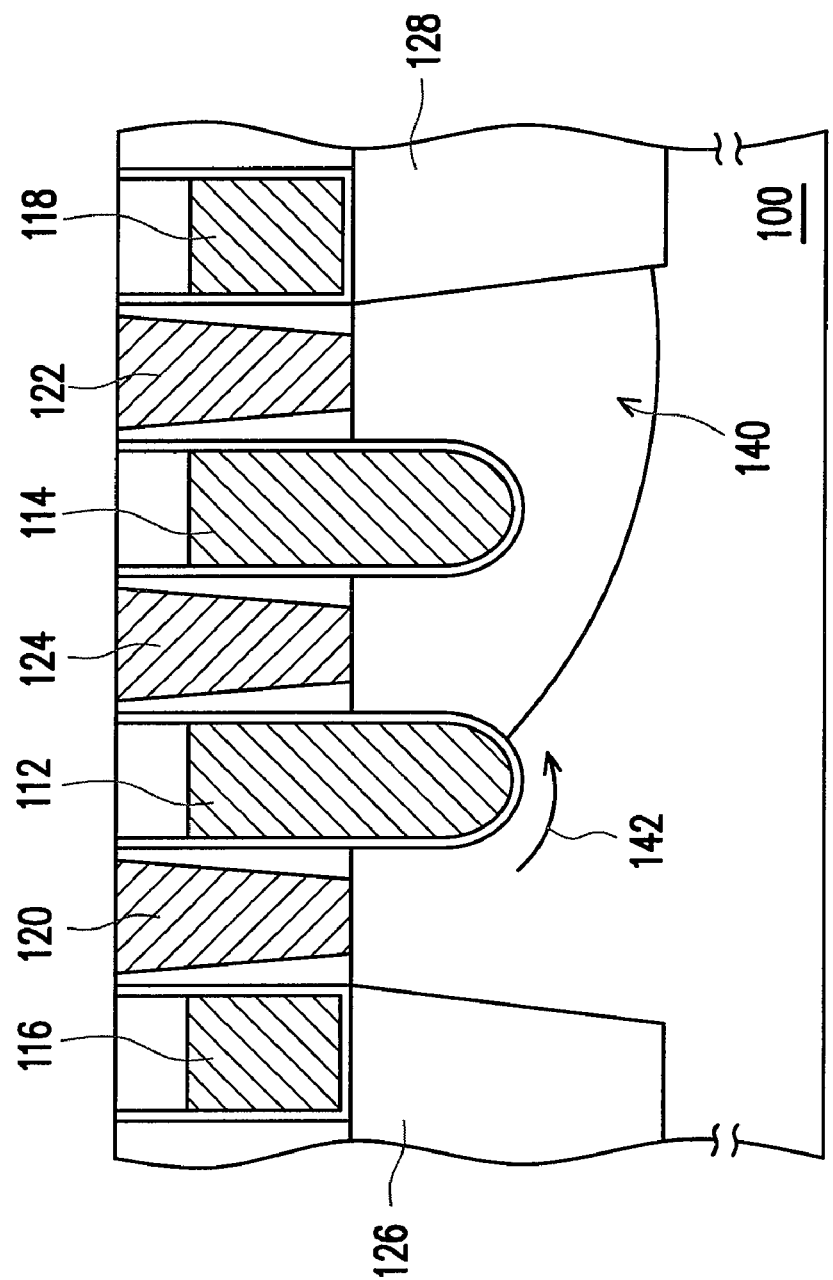
FIG. 5 is a cross-sectional view of a word line along II-II' line of FIG. 4.

FIG. 4 is a top view of a DRAM being tested by a first type leakage test according to an embodiment of the present invention. FIG. 5 is a cross-sectional view of a word line along II-II' line of FIG. 4. In the drawings of FIGS. 4 and 5, those elements equivalent with those in the drawings of FIGS. 1 and 2 are marked with same numerals, and the discussion thereto is also omitted hereby.

Referring to FIGS. 4 and 5, the current embodiment is exemplified with testing the first storage unit 134 of the memory cell 106. The leakage testing method includes the following steps.

First, the first storage unit 134 and the second storage unit 136 of a same memory cell 106 are programmed so as to be set with different storage statues. For example, the first storage unit 134 is programmed to be set with the second storage status "1", and the second storage unit 136 is programmed to be set with the first storage status "0".

Then, one of word lines (e.g., the word line WL4) extending through the memory cell 106 is disturbed.

Afterwards, the DRAM is determined to be acceptable or not. When the disturbance to the word line WL4 extending through the memory cell 106 causes a reading error of the word line WL3 extending through the memory cell 106, a failure is determined as occurred, and the failure is attributed to a leakage type of extended depletion region. In the current embodiment, the reading error of the word line WL3 is that when reading the first storage unit 134 of the memory cell 106, the word line WL3 reads a data other than "1" as it should be.

In this case, a reason causing the failure is that when the word line WL4 is disturbed, a depletion region 140 under the word line WL4 will extend, so that a leakage path 142 between the first storage unit 134 and the bit line BL1 is shortened, which causes the leakage current occurring.

On the contrary, when the disturbance to the word line WL4 extending through the memory cell 106 does not cause a reading error of the word line WL3 extending through the memory cell 106, the DRAM is determined as acceptable.

Likewise, the second storage unit 136 of the memory cell 106 can be tested by disturbing the word line WL3 and reading the word line WL4 for determining whether there is a failure occurred of the second storage unit 136. Testing method for the storage units of other memory cells can be learnt by those having ordinary skill in the art by referring to the foregoing embodiment, and is not to be iterated hereby.

As discussed above, the first type leakage test is featured by taking two word lines of a same memory cell as a group and storing different data types in the first storage unit and the second storage unit of the memory cell, so as to allow determining whether there is a leakage current caused by an extended depletion region occurred by disturbing one of the word lines and reading another one word line.

Figure 6:
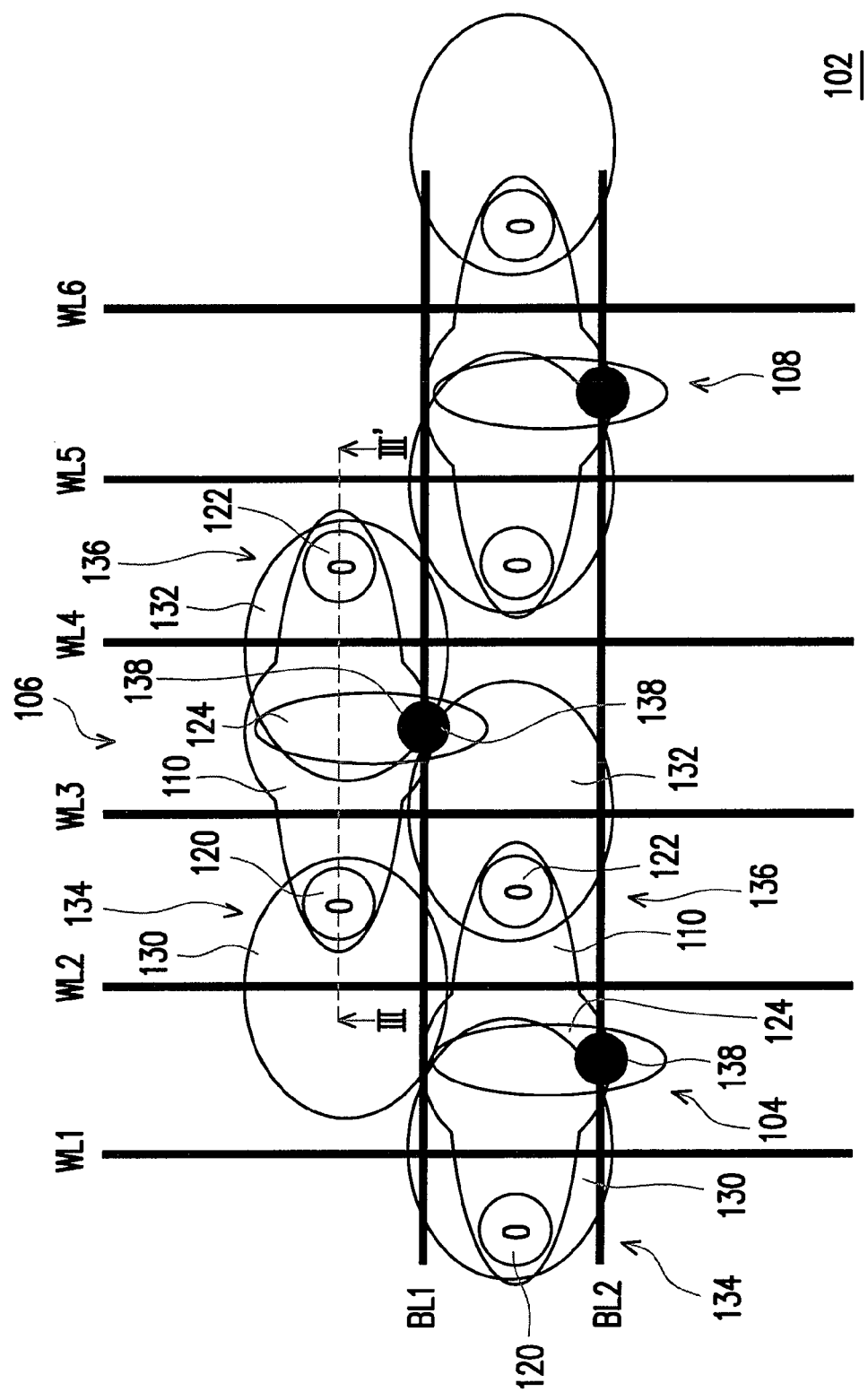
FIG. 6 is a top view of a DRAM being tested by a second type leakage test according to an embodiment of the present invention.
Figure 7:
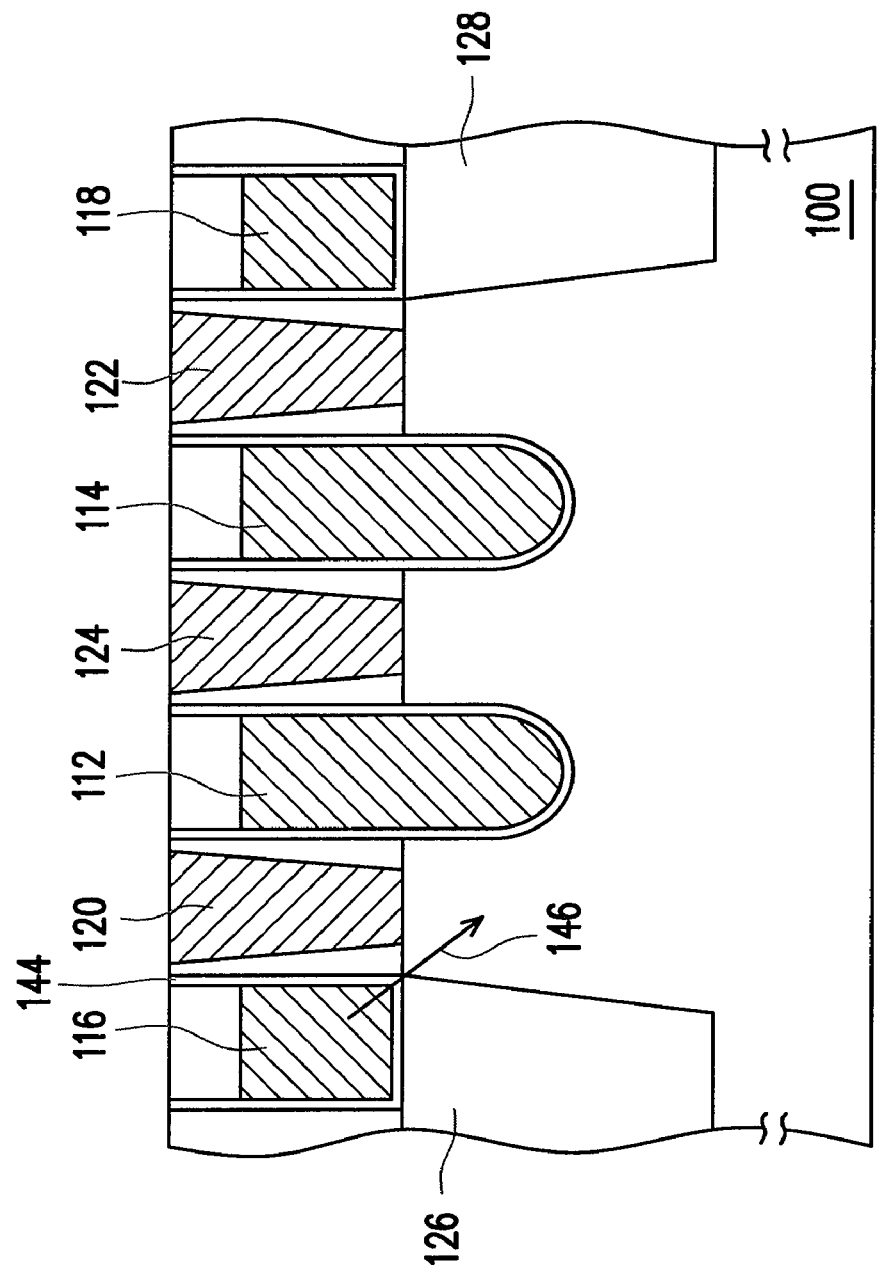
FIG. 7 is a cross-sectional view of a word line along III-III' line of FIG. 6.

FIG. 6 is a top view of a DRAM being tested by a second type leakage test according to an embodiment of the present invention. FIG. 7 is a cross-sectional view of a word line along III-III' line of FIG. 6. In the drawings of FIGS. 6 and 7, those elements equivalent with those in the drawings of FIGS. 1 and 2 are marked with same numerals, and the discussion thereto is also omitted hereby.

Referring to FIGS. 6 and 7 together, the current embodiment is exemplified with testing the first storage unit 134 of the memory cell 106. The leakage testing method includes the following steps.

First, all of the first storage units 134 and the second storage units 136 are set with the first storage status "0".

Then, the word line WL2 extending through the memory cell 104 is disturbed.

Afterwards, the DRAM is determined to be acceptable or not. Specifically, when the disturbance to the word line WL2 extending through the memory cell 104 causes a reading error of the word line WL3 extending through the memory cell 106, a failure is determined as occurred, and the failure is attributed to a leakage type of defective dielectric layer between passing gate and active area. In the current embodiment, the reading error of the word line WL3 is that when reading the first storage unit 134 of the memory cell 106, the word line WL3 reads a data other than "0" as it should be.

In this case, a reason causing the failure is that when disturbing the word line WL2, because of the defects occurred in the dielectric layer 144 between the passing gate 116 and the active area 110 of the memory cell 106 (e.g., the dielectric layer 144 is too thin, or there are impurities existed in the dielectric layer 144), a leakage current path 146 occurs between the passing gate 116 and the active area 110 of the memory cell 106, which causes the leakage current.

On the contrary, when the disturbance to the word line WL2 extending through the memory cell 104 does not cause a reading error of the word line WL3 extending through the memory cell 106, the DRAM is determined as acceptable.

Similarly, the second storage unit 136 of the memory cell 104 can be tested by disturbing the word line WL3 and reading the word line WL2 for determining whether there is a failure occurred of the second storage unit 136 of the memory cell 104. Testing method for the storage units of other memory cells can be learnt by those having ordinary skill in the art by referring to the foregoing embodiment, and is not to be iterated hereby.

As discussed above, the second type leakage test is featured by taking two adjacent word lines extending through two adjacent memory cells of different memory cell rows as a group and storing data type of "0" in all storage units of all memory cells, so as to allow determining whether there is a leakage current caused by a defective dielectric layer between passing gate and active area occurred by disturbing one of the word lines and reading another one word line.

Figure 8:
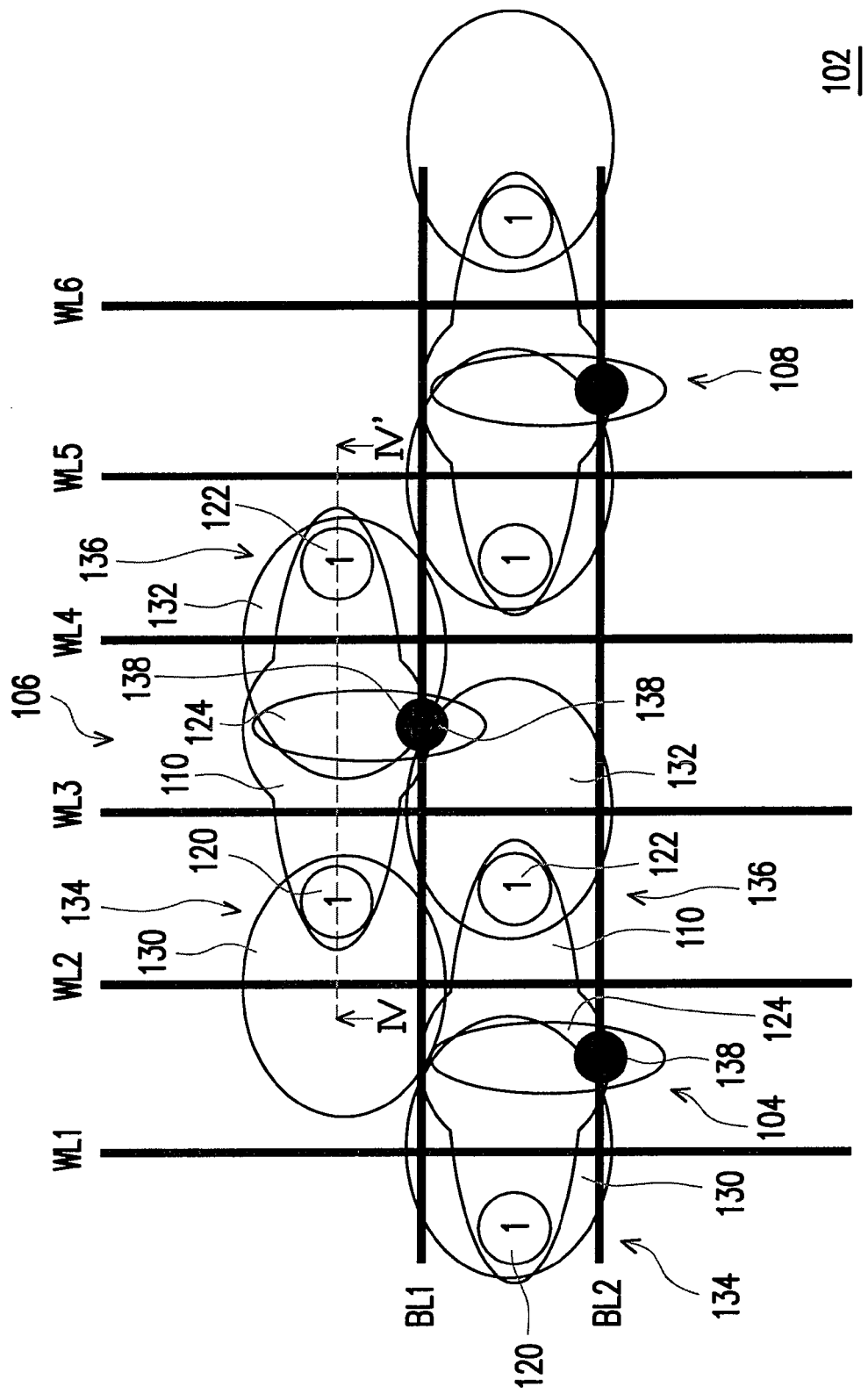
FIG. 8 is a top view of a DRAM being tested by a third type leakage test according to an embodiment of the present invention.
Figure 9:
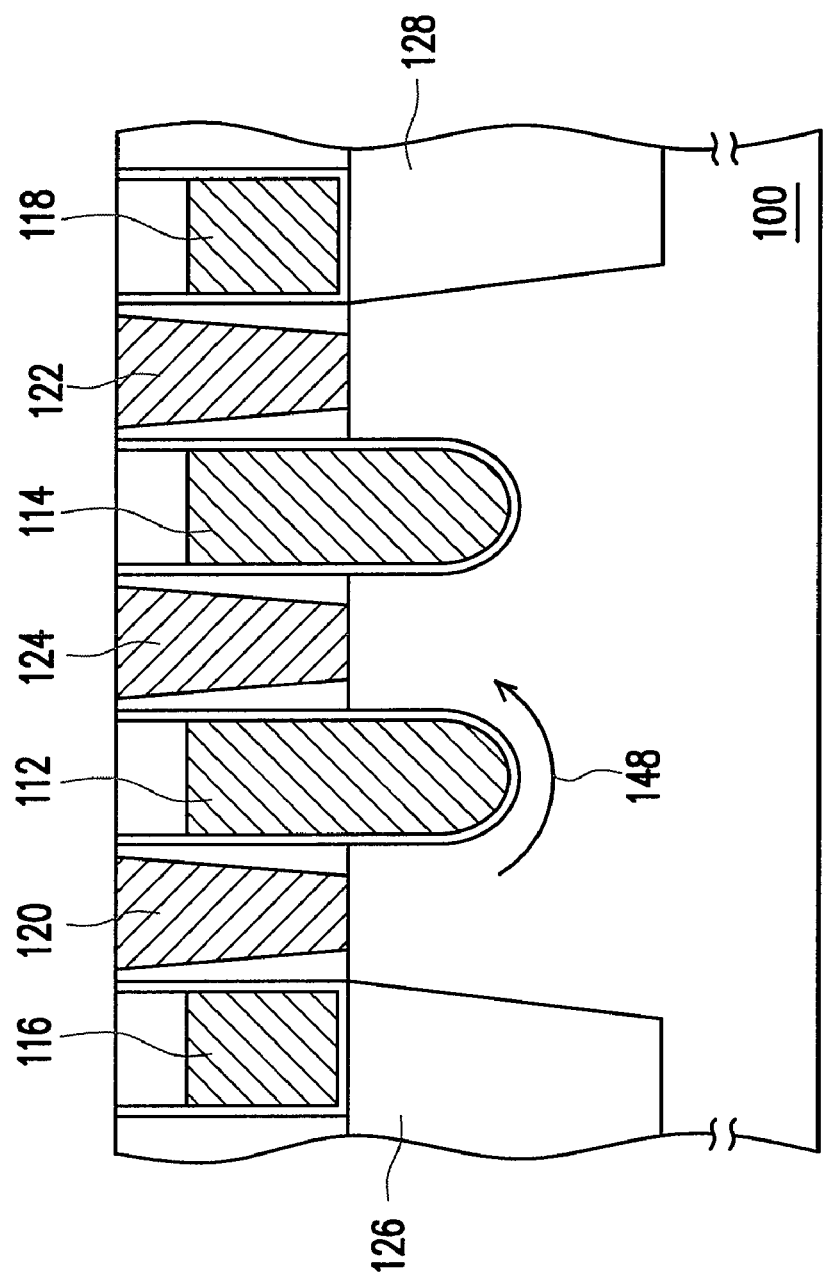
FIG. 9 is a cross-sectional view of a word line along IV-IV' line of FIG. 8.

FIG. 8 is a top view of a DRAM being tested by a third type leakage test according to an embodiment of the present invention. FIG. 9 is a cross-sectional view of a word line along IV-IV' line of FIG. 8. In the drawings of FIGS. 8 and 9, those elements equivalent with those in the drawings of FIGS. 1 and 2 are marked with same numerals, and the discussion thereto is also omitted hereby.

Referring to FIGS. 8 and 9 together, the current embodiment is exemplified with testing the first storage unit 134 of the memory cell 106. The leakage testing method includes the following steps.

First, all of the first storage units 134 and the second storage unit 136 are programmed to be set with the second storage status "1".

Then, the word line WL2 extending through the memory cell 104 is disturbed.

Afterwards, the DRAM is determined as acceptable or not. Specifically, when the disturbance to the word line WL2 extending through the memory cell 104 causes a reading error of the word line WL3 extending through the memory unit 106, a failure is determined as occurred, and the failure is attributed to a leakage type of temporary increase of storage electrical potential of storage unit. In the current embodiment, the reading error of the word line WL3 is that when reading the first storage unit 134 of the memory cell 106, the word line WL3 reads a data other than "1" as it should be.

In this case, a reason causing the failure is that when disturbing the word line WL2, because of a coupling effect between the passing gate 116 and the contact window 120 of the memory cell 106, the storage electrical potential of the first storage unit 134 is temporarily raised, so that a leakage current path 148 occurs between the first storage unit 134 and the bit line BL1, which causes the leakage current.

On the contrary, when the disturbance to the word line WL2 extending through the memory cell 104 does not cause a reading error of the word line WL3 extending through the memory cell 106, the DRAM is determined as acceptable.

Similarly, the second storage unit 136 of the memory cell 104 can be tested by disturbing the word line WL3 and reading the word line WL2 for determining whether there is a failure occurred of the second storage unit 136 of the memory cell 104. Testing method for the storage units of other memory cells can be learnt by those having ordinary skill in the art by referring to the foregoing embodiment, and is not to be iterated hereby.

As discussed above, the third type leakage test is featured by taking two adjacent word lines extending through two adjacent memory cells of different memory cell rows as a group and storing data type of "1" in all storage units of all memory cells, so as to allow determining whether there is a leakage current caused by a temporary increase of storage electrical potential of storage unit occurred by disturbing one of the word lines and reading another one word line.

Figure 10:
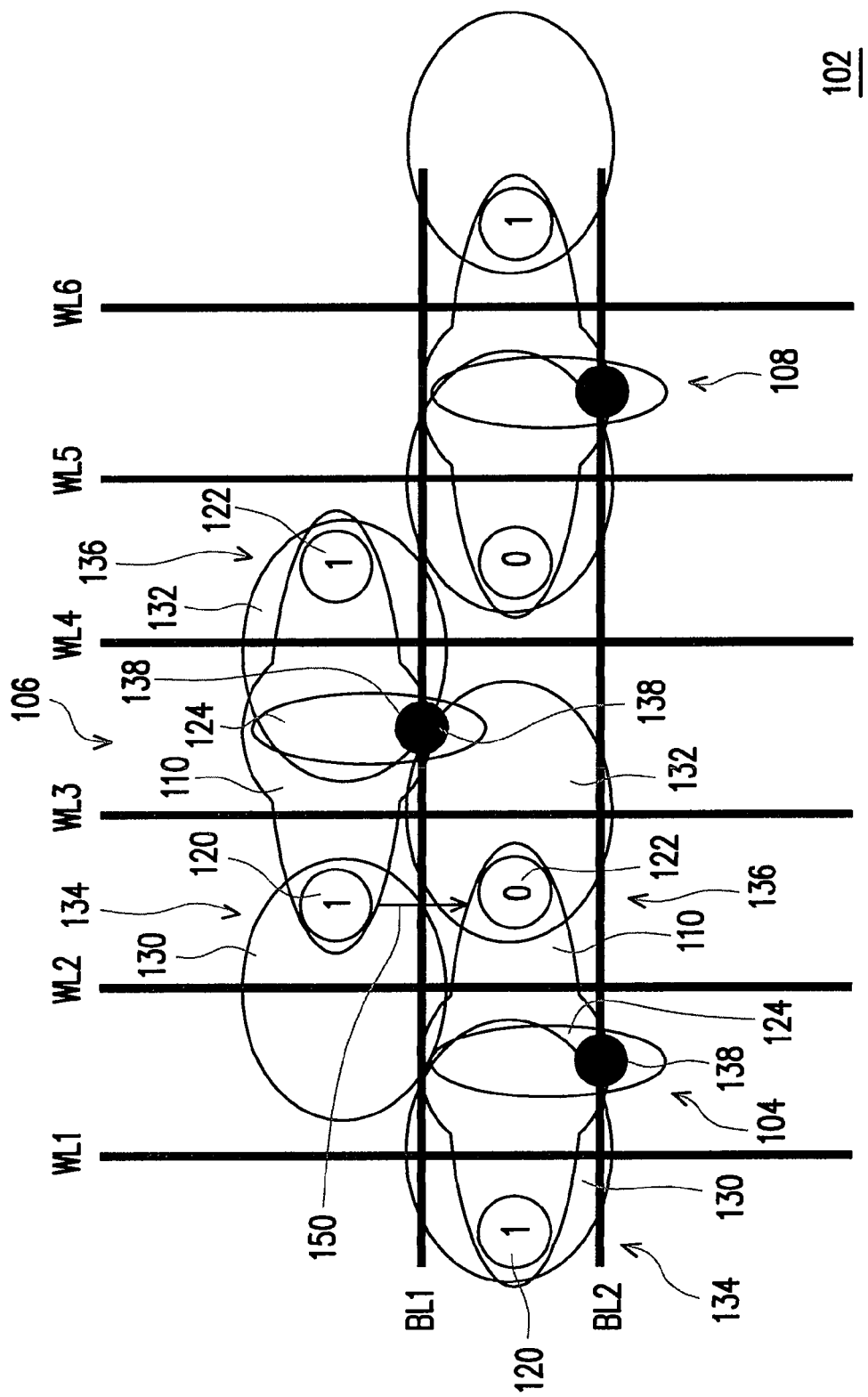
FIG. 10 is a top view of a DRAM being tested by a fourth type leakage test according to an embodiment of the present invention.

FIG. 10 is a top view of a DRAM being tested by a fourth type leakage test according to an embodiment of the present invention. In FIG. 10, those elements equivalent with those in FIG. 1 are marked with same numerals, and the discussion thereto is also omitted hereby.

Referring to FIG. 10, the current embodiment is exemplified with testing the first storage unit 134 of the memory cell 106. The leakage testing method includes the following steps.

First, the second storage unit 136 of the memory cell 104 and the first storage unit 134 of the memory cell 106 are programmed to be set with different storage statues. For example, the second storage unit 136 of the memory cell 104 is programmed to be set with the first storage status "0", and the first storage unit 134 of the memory unit 106 is programmed to be set with the second storage status "1".

Then, the word line WL2 extending through the memory cell 104 is disturbed.

Afterwards, the DRAM is determined as acceptable or not. Specifically, when the disturbance to the word line WL2 extending through the memory cell 104 causes a reading error of the word line WL3 extending through the memory unit 106, a failure is determined as occurred, and the failure is attributed to a leakage type of isolation structure having void. In the current embodiment, the reading error of the word line WL3 is that when reading the first storage unit 134 of the memory cell 106, the word line WL3 reads a data other than "1" as it should be.

In this case, a reason causing the failure is that when disturbing the word line WL2, because of a void occurred in an isolation structure (not shown) between the memory cell 104 and the memory cell 106, a leakage current path 150 occurs between the second storage unit 136 of the memory cell 104 and the first storage unit 134 of the memory cell 106, which causes the leakage current.

On the contrary, when the disturbance to the word line WL2 extending through the memory cell 104 does not cause a reading error of the word line WL3 extending through the memory cell 106, the DRAM is determined as acceptable.

Similarly, the second storage unit 136 of the memory cell 104 can be tested by disturbing the word line WL3 and reading the word line WL2 for determining whether there is a failure occurred of the second storage unit 136 of the memory cell 104. Testing method for the storage units of other memory cells can be learnt by those having ordinary skill in the art by referring to the foregoing embodiment, and is not to be iterated hereby.

As discussed above, the fourth type leakage test is featured by taking two adjacent word lines extending through two adjacent memory cells of different memory cell rows as a group and setting the first storage unit and the second storage unit of different memory cell rows with different data types, so as to allow determining whether there is a leakage current caused by a void presented in an isolation structure by disturbing one of the word lines and reading another one word line.

Figure 11:
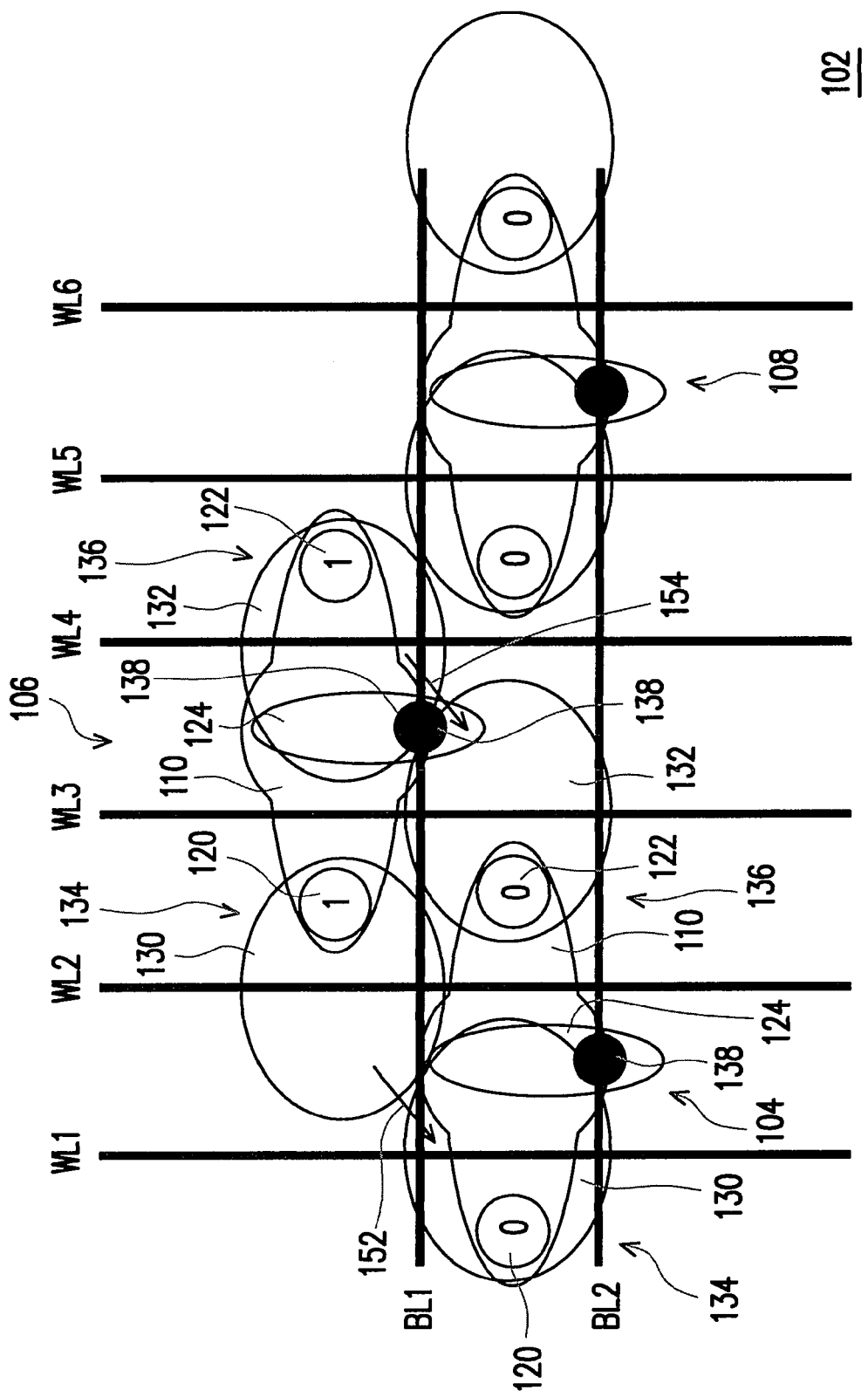
FIG. 11 is a top view of a DRAM being tested by a fifth type leakage test according to an embodiment of the present invention.

FIG. 11 is a top view of a DRAM being tested by a fifth type leakage test according to an embodiment of the present invention. In FIG. 11, those elements equivalent with those in FIG. 1 are marked with same numerals, and the discussion thereto is also omitted hereby.

Referring to FIG. 11, the current embodiment is exemplified with testing the first storage unit 134 of the memory cell 106. The leakage testing method includes the following steps.

First, the first storage unit 134 of the memory cell 104 and the first storage unit 134 of the memory cell 106 are programmed to be set with different storage statues. For example, the first storage unit 134 of the memory cell 104 is programmed to be set with the first storage status "0", and the first storage unit 134 of the memory unit 106 is programmed to be set with the second storage status "1".

Then, the word line WL1 extending through the memory cell 104 is disturbed.

Afterwards, the DRAM is determined as acceptable or not. Specifically, when the disturbance to the word line WL1 extending through the memory cell 104 causes a reading error of the word line WL3 extending through the memory unit 106, a failure is determined as occurred, and the failure is attributed to a leakage type of defective dielectric layer between two adjacent capacitors. In the current embodiment, the reading error of the word line WL3 is that when reading the first storage unit 134 of the memory cell 106, the word line WL3 reads a data other than "1" as it should be.

In this case, a reason causing the failure is that when disturbing the word line WL1, because of a defect presented a dielectric layer between the capacitor 130 of the memory cell 104 and the capacitor 130 of the memory cell 106 (e.g., the dielectric layer is too thin, or contains unacceptable impurities), a leakage current path 152 occurs between the capacitor 130 of the memory cell 104 and the capacitor 130 of the memory cell 106, which causes the leakage current.

On the contrary, when the disturbance to the word line WL1 extending through the memory cell 104 does not cause a reading error of the word line WL3 of the memory cell 106, the DRAM is determined as acceptable.

Similarly, the first storage unit 134 of the memory cell 104 can be tested by disturbing the word line WL3 and reading the word line WL1 for determining whether there is a failure occurred of the first storage unit 134 of the memory cell 104. Testing method for the storage units of other memory cells can be learnt by those having ordinary skill in the art by referring to the foregoing embodiment, and is not to be iterated hereby.

As discussed above, the fifth type leakage test is adapted for testing the first storage units. The fifth type leakage test is also adapted for testing the second storage units as exemplified below by testing the second storage unit 136 of the memory cell 106. The leakage testing method includes the following steps.

First, the second storage unit 136 of the memory cell 104 and the second storage unit 136 of the memory cell 106 are programmed to be set with different storage statues. For example, the second storage unit 136 of the memory cell 104 is programmed to be set with the first storage status "0", and the second storage unit 136 of the memory unit 106 is programmed to be set with the second storage status "1".

Then, the word line WL2 extending through the memory cell 104 is disturbed.

Afterwards, the DRAM is determined as acceptable or not. Specifically, when the disturbance to the word line WL2 extending through the memory cell 104 causes a reading error of the word line WL4 extending through the memory unit 106, a failure is determined as occurred, and the failure is attributed to a leakage type of defective dielectric layer between two adjacent capacitors. In the current embodiment, the reading error of the word line WL4 is that when reading the second storage unit 136 of the memory cell 106, the word line WL4 reads a data other than "1" as it should be.

In this case, a reason causing the failure is that when disturbing the word line WL2, because of a defect presented a dielectric layer between the capacitor 132 of the memory cell 104 and the capacitor 132 of the memory cell 106 (e.g., the dielectric layer is too thin, or contains unacceptable impurities), a leakage current path 154 occurs between the capacitor 132 of the memory cell 104 and the capacitor 132 of the memory cell 106, which causes the leakage current.

On the contrary, when the disturbance to the word line WL2 extending through the memory cell 104 does not cause a reading error of the word line WL4 extending through the memory cell 106, the DRAM is determined as acceptable.

Similarly, the second storage unit 136 of the memory cell 104 can be tested by disturbing the word line WL4 and reading the word line WL2 for determining whether there is a failure occurred of the second storage unit 136 of the memory cell 104. Testing method for the storage units of other memory cells can be learnt by those having ordinary skill in the art by referring to the foregoing embodiment, and is not to be iterated hereby.

As discussed above, the fifth type leakage test is featured by taking two adjacent word lines extending through two adjacent memory cells of different memory cell rows and for reading two adjacent first storage units (or second storage units) located at different memory cell rows as a group, and setting the two first storage units (or second storage units) of different memory cell rows with different data types, so as to allow determining whether there is a leakage current caused by a defective dielectric layer between two adjacent capacitors by disturbing one of the word lines and reading another one word line.

As discussed above, five different types of leakage testing method are provided. However, exactly which of the five types should be executed with respect to a specific DRAM, and the sequence of execution of the selected types are not restricted. In general, it is preferred to execute the first type leakage test first, and then selectively execute others.

As such, the leakage testing method for a DRAM having a recess gate according to the present invention is adapted for fast testing leakage current by selecting specific data topology types, and disturbing specific word lines and reading operation, and is also adapted for finding out the reason of the leakage occurrence, and is helpful for improving the processing and the product quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A leakage testing method for a dynamic random access memory having a recess gate adapted for applying for a memory array, wherein the memory array comprises a plurality of memory cells, sequentially and parallel arranged word lines, and a plurality of sequentially and parallel arranged bit lines, the word lines are substantially perpendicular with the bit lines, the bit lines include a first bit line and a second bit line, the first bit line and the second bit line are connected with a first memory cell and a second memory cell of the plurality of memory cells, respectively, the first memory cell and the second memory cell comprise a first storage unit and a second storage unit, respectively, each first storage unit and each second storage unit are at a first storage status and a second storage status, respectively, a storage electrical potential of the first storage status is lower than a storage electrical potential of the second storage status, the word lines comprises a first word line, a second word line, a third word line, and a fourth word line, the first word line and the second word line are extending between the first storage unit and the second storage unit of the first memory cell, the third word line and the fourth word line are extending between the first storage unit and the second storage unit of the second memory cell, and the second storage unit of the first memory cell is adjacent to the first storage unit of the second memory cell, the leakage testing method comprising:
programming to set the first storage unit and the second storage unit of a same memory cell with different storage statuses;
disturbing one of the word lines extending through each of the memory cells; and
determining whether the DRAM is acceptable or not, wherein
when another one of the word lines extending through each of the memory cells is caused with a reading error by disturbing the one of the word lines extending through each of the memory cells, a failure is determined as occurred, and the failure is attributed to a leakage type of extended depletion region, and
when the another one of the word lines extending through each of the memory cells is not caused with a reading error by disturbing the one of the word lines extending through each of the memory cells, the DRAM is determined as acceptable.

2. The leakage testing method according to claim 1, after determining the DRAM as acceptable, further comprising:
programming to set all of the first storage units and the second storage units with the first storage status;
disturbing the second word line; and
determining whether the DRAM is acceptable or not, wherein
when the disturbance to the second word line causes a reading error of the third word line, a failure is determined as occurred, and the failure is attributed to a leakage type of defective dielectric layer between passing gate and active area, and
when the disturbance to the second word line does not cause a reading error of the third word line, the DRAM is determined as acceptable.

3. The leakage testing method according to claim 2, after determining the DRAM as acceptable when the disturbance to the second word line does not cause a reading error of the third word line, further comprising:
programming to set all of the first storage units and the second storage units with the first storage status;
disturbing the third word line; and
determining whether the DRAM is acceptable or not, wherein
when the disturbance to the third word line causes a reading error of the second word line, a failure is determined as occurred, and the failure is attributed to a leakage type of defective dielectric layer between passing gate and active area, and
when the disturbance to the third word line does not cause a reading error of the second word line, the DRAM is determined as acceptable.

4. The leakage testing method according to claim 1, after determining the DRAM as acceptable, further comprising:
programming to set all of the first storage units and the second storage units with the second storage status;
disturbing the second word line; and
determining whether the DRAM is acceptable or not, wherein
when the disturbance to the second word line causes a reading error of the third word line, a failure is determined as occurred, and the failure is attributed to a leakage type of temporary increase of storage electrical potential of storage unit, and
when the disturbance to the second word line does not cause a reading error of the third word line, the DRAM is determined as acceptable.

5. The leakage testing method according to claim 4, after determining the DRAM as acceptable when the disturbance to the second word line does not cause a reading error of the third word line, further comprising:
programming to set all of the first storage units and the second storage units with the second storage status;
disturbing the third word line; and
determining whether the DRAM is acceptable or not, wherein when the disturbance to the third word line causes a reading error of the second word line, a failure is determined as occurred, and the failure is attributed to a leakage type of temporary increase of storage electrical potential of storage unit, and when the disturbance to the third word line does not cause a reading error of the second word line, the DRAM is determined as acceptable.

6. The leakage testing method according to claim 1, after determining the DRAM as acceptable, further comprising:

programming to set the second storage unit of the first memory cell and the first storage unit of the second memory cell with different storage statues;

disturbing the second word line; and determining whether the DRAM is acceptable or not, wherein when the disturbance to the second word line causes a reading error of the third word line, a failure is determined as occurred, and the failure is attributed to a leakage type of isolation structure having void, and when the disturbance to the second word line does not cause a reading error of the third word line, the DRAM is determined as acceptable.

7. The leakage testing method according to claim 6, after determining the DRAM as acceptable when the disturbance to the second word line does not cause a reading error of the third word line, further comprising:

programming to set the second storage unit of the first memory cell and the first storage unit of the second memory cell with different storage statues;

disturbing the third word line; and determining whether the DRAM is acceptable or not, wherein when the disturbance to the third word line causes a reading error of the second word line, a failure is determined as occurred, and the failure is attributed to a leakage type of isolation structure having void, and when the disturbance to the third word line does not cause a reading error of the second word line, the DRAM is determined as acceptable.

8. The leakage testing method according to claim 1, after determining the DRAM as acceptable, further comprising:

programming to set the first storage unit of the first memory cell and the first storage unit of the second memory cell with different storage statues;

disturbing the first word line; and determining whether the DRAM is acceptable or not, wherein when the disturbance to the first word line causes a reading error of the third word line, a failure is determined as occurred, and the failure is attributed to a leakage type of defective dielectric layer between two adjacent capacitors, and when the disturbance to the first word line does not cause a reading error of the third word line, the DRAM is determined as acceptable.

9. The leakage testing method according to claim 8, after determining the DRAM as acceptable when the disturbance to the first word line does not cause a reading error of the third word line, further comprising:

programming to set the first storage unit of the first memory cell and the first storage unit of the second memory cell with different storage statues;

disturbing the third word line; and determining whether the DRAM is acceptable or not, wherein when the disturbance to the third word line causes a reading error of the first word line, a failure is determined as occurred, and the failure is attributed to a leakage type of defective dielectric layer between two adjacent capacitors, and when the disturbance to the third word line does not cause a reading error of the first word line, the DRAM is determined as acceptable.

10. The leakage testing method according to claim 8, after determining the DRAM as acceptable when the disturbance to the first word line does not cause a reading error of the third word line, further comprising:

programming to set the second storage unit of the first memory cell and the second storage unit of the second memory cell with different storage statues;

disturbing the second word line; and determining whether the DRAM is acceptable or not, wherein when the disturbance to the second word line causes a reading error of the fourth word line, a failure is determined as occurred, and the failure is attributed to a leakage type of defective dielectric layer between two adjacent capacitors, and when the disturbance to the second word line does not cause a reading error of the fourth word line, the DRAM is determined as acceptable.

11. The leakage testing method according to claim 10, after determining the DRAM as acceptable when the disturbance to the second word line does not cause a reading error of the fourth word line, further comprising:

programming to set the second storage unit of the first memory cell and the second storage unit of the second memory cell with different storage statues;

disturbing the fourth word line; and determining whether the DRAM is acceptable or not, wherein when the disturbance to the fourth word line causes a reading error of the second word line, a failure is determined as occurred, and the failure is attributed to a leakage type of defective dielectric layer between two adjacent capacitors, and when the disturbance to the fourth word line does not cause a reading error of the second word line, the DRAM is determined as acceptable.

12. The leakage testing method according to claim 1, wherein the operation of disturbing a selected word line comprises:

(1) turning on the selected word line;

(2) turning off the selected word line; and (3) repeating steps (1) and (2).

13. The leakage testing method according to claim 1, wherein operation factors of the disturbing operation comprise an operation times.

14. The leakage testing method according to claim 1, wherein operation factors of the disturbing operation comprises an operation time.

* * * * *